United States Patent
Hatano

(10) Patent No.: US 10,153,747 B2
(45) Date of Patent: Dec. 11, 2018

(54) SURFACE ACOUSTIC WAVE ELEMENT

(71) Applicant: WISOL JAPAN CO., LTD., Kawasaki-shi, Kanagawa (JP)

(72) Inventor: Koichi Hatano, Yokohama (JP)

(73) Assignee: WISOL JAPAN CO., LTD., Kawasaki-Shi, Kanagawa (JP)

( * ) Notice: Subject to any disclaimer, the term of this patent is extended or adjusted under 35 U.S.C. 154(b) by 253 days.

(21) Appl. No.: 15/215,867

(22) Filed: Jul. 21, 2016

(65) Prior Publication Data
US 2017/0040970 A1 Feb. 9, 2017

(30) Foreign Application Priority Data
Aug. 5, 2015 (KR) .................... 10-2015-0110590

(51) Int. Cl.
*H03H 9/02* (2006.01)
*H03H 9/64* (2006.01)
*H03H 9/72* (2006.01)

(52) U.S. Cl.
CPC ...... *H03H 9/02992* (2013.01); *H03H 9/6436* (2013.01); *H03H 9/6483* (2013.01); *H03H 9/725* (2013.01)

(58) Field of Classification Search
CPC ............ H03H 9/02992; H03H 9/6436; H03H 9/6483; H03H 9/725
USPC .......................... 333/133, 193–196
See application file for complete search history.

(56) References Cited

U.S. PATENT DOCUMENTS

| 7,012,480 B2* | 3/2006 | Nakamura | H03H 9/0038 |
| | | | 333/133 |
| 2007/0090895 A1* | 4/2007 | Nishizawa | H03H 9/0057 |
| | | | 333/133 |

FOREIGN PATENT DOCUMENTS

| JP | 2004-194269 A | 7/2004 |
| JP | 2006-042398 A | 2/2006 |

* cited by examiner

*Primary Examiner* — Robert J Pascal
*Assistant Examiner* — Jorge L Salazar, Jr.
(74) *Attorney, Agent, or Firm* — LRK Patent Law Firm

(57) ABSTRACT

A surface acoustic wave element includes: a first input wire; a first IDT connected to the first input wire; a second input wire; a second IDT connected to the second input wire; an output wire; and a third IDT connected to the output wire and installed between the first IDT and the second IDT, wherein the first input wire, the second input wire and the output wire are adjacent to each other and withdrawn in a same direction, and a capacitance pattern for applying capacitance is connected at least either between the first IDT and the third IDT or between the second IDT and the third IDT.

14 Claims, 20 Drawing Sheets

SURFACE ACOUSTIC WAVE ELEMENT

CROSS REFERENCE TO RELATED APPLICATION

This application claims priority to Korean Patent Application No. 10-2015-0110590, filed Aug. 5, 2015, which is hereby incorporated by reference in its entirety into this application.

BACKGROUND OF THE INVENTION

1. Field of the Invention

The present invention relates to a surface acoustic wave element.

2. Background of the Related Art

A Surface Acoustic Wave (SAW) element is mounted on an antenna sharing device of a communication device, such as a portable terminal or the like, to pass a signal of a specific frequency band. A surface acoustic wave element of a longitudinal mode combination type configured of a plurality of comb-shaped electrodes (IDT: Inter Digital Transducers) is known as a surface acoustic wave element.

Generally, a portable terminal or the like adopts a communication method in which a frequency band of a reception Rx signal (hereinafter, referred to as a reception band) communicates in a high frequency band, compared with a frequency band of a transmission Tx signal (hereinafter, referred to as a transmission band). However, recently, a communication method in which the reception band is adjacent to the transmission band and, in addition, the transmission band communicates through a signal of a frequency higher than that of the reception band is also appeared.

As described above, in order to realize stable communication while the reception band is higher than and adjacent to the transmission band, a characteristic of steep and large attenuation at the high band side of the reception band is required in a surface acoustic wave element. In addition, when a communication using two or more bands is performed using one common antenna, it is regarded that a characteristic of steeply and highly attenuating a signal even in an attenuation band of the low band side, as well as the high band side, of the reception band will be required.

Patent documents 1 and 2 disclose a surface acoustic wave filter having a steep cutoff characteristic of low loss. Such a surface acoustic wave filter is a Double Mode SAW (DMS) filter and realizes the steep cutoff characteristic of low loss by withdrawing an input terminal and an output terminal in the same direction. In addition, they also describe that the cutoff characteristic of the surface acoustic wave filter can be improved by decreasing the opening of the IDT.

(Patent documents 1) Gazette of Japanese Laid-opened Patent No. 2004-194269

(Patent documents 2) Gazette of Japanese Laid-opened Patent No. 2006-42398

SUMMARY OF THE INVENTION

It is proved that, there is a problem in the surface acoustic wave filter described in the Patent documents 1 and 2 that insertion loss increases since a mismatch occurs between input impedance and output impedance if the length of the opening of the IDT is small. In addition, Patent documents 1 and 2 describe a structure of connecting a DMS filter in parallel to solve the mismatch between the input impedance and the output impedance. However, Patent documents 1 and 2 do not consider at all how to solve the mismatch between the input impedance and the output impedance using a surface acoustic wave other than the DMS filter.

Therefore, the present invention has been made in view of the above problem, and it is an object of the present invention to provide a surface acoustic wave element having a steep and large attenuation characteristic of low loss without being limited to a DMS filter.

To accomplish the above object, according to one aspect of the present invention, there is provided a surface acoustic wave element including: a first input wire; a first IDT connected to the first input wire; a second input wire; a second IDT connected to the second input wire; an output wire; and a third IDT connected to the output wire and installed between the first IDT and the second IDT, in which the first input wire, the second input wire and the output wire are adjacent to each other and withdrawn in the same direction, and a capacitance pattern for applying capacitance is connected at least either between the first IDT and the third IDT or between the second IDT and the third IDT.

According to another aspect of the present invention, there is provided a surface acoustic wave element including: a first input wire; a first IDT connected to the first input wire; a second input wire; a second IDT connected to the second input wire; an output wire; a third IDT connected to the output wire and installed between the first IDT and the second IDT; and a first reflector and a second reflector installed on both sides of the first to third IDTs, in which the first input wire, the second input wire and the output wire are adjacent to each other and withdrawn in the same direction, and the first reflector is connected to the first input wire, and the second reflector is connected to the second input wire.

According to still another aspect of the present invention, there is provided a surface acoustic wave element including: a first input wire; a first IDT connected to the first input wire; a second input wire; a second IDT connected to the second input wire; an output wire; and a third IDT connected to the output wire and installed between the first IDT and the second IDT, in which the first input wire, the second input wire and the output wire are adjacent to each other and withdrawn in the same direction, and a capacitance pattern for applying capacitance is connected at least either between the first IDT and the third IDT or between the second IDT and the third IDT, and the surface acoustic wave element is connected to at least one resonator.

According to still another aspect of the present invention, there is provided a surface acoustic wave element including: a first input wire; a first IDT connected to the first input wire; a second input wire; a second IDT connected to the second input wire; an output wire; a third IDT connected to the output wire and installed between the first IDT and the second IDT; and a first reflector and a second reflector installed on both sides of the first to third IDTs, in which the first input wire, the second input wire and the output wire are adjacent to each other and withdrawn in the same direction, and the first reflector is connected to the first input wire, and the second reflector is connected to the second input wire, and the surface acoustic wave element is connected to at least one resonator.

BRIEF DESCRIPTION OF THE DRAWINGS

FIG. 16 is a mimetic view showing the configuration of a surface acoustic wave element related to a second modification of a third embodiment of the present invention.

DETAILED DESCRIPTION OF THE PREFERRED EMBODIMENT

Figure 1:
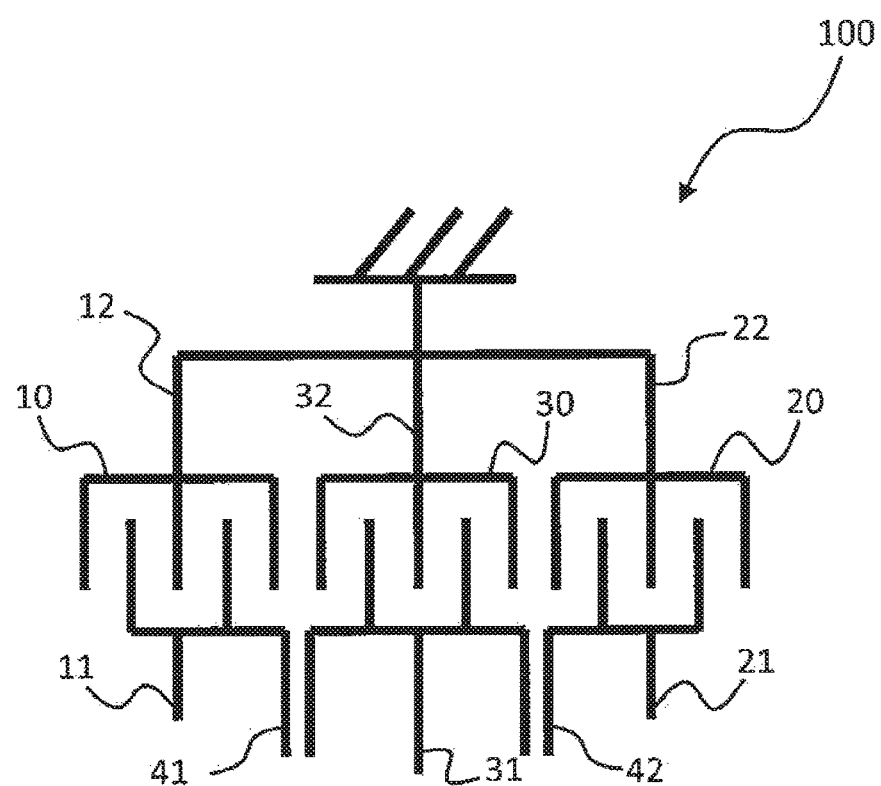
FIG. 1 is a mimetic view showing the configuration of an IDT included in a surface acoustic wave element related to a first embodiment of the present invention.

Hereinafter, embodiments of the present invention will be described in detail with reference to the accompanying drawings. In addition, to avoid complication of repetition, like or equivalent elements in the drawings will be denoted by like reference numerals, and descriptions thereof will be omitted appropriately.

1. First Embodiment

FIG. 1 is a mimetic view showing the configuration of en IDT of a surface acoustic wave element 100 related to a first embodiment of the present invention.

The surface acoustic wave element 100 shown in the figure includes a first IDT 10, a second IDT 20, a third IDT 30, a first electrode 41 and a second electrode 42.

The first IDT 10 is an input IDT connected to a first input wire 11 for inputting an input signal. In addition, in the first IDT 10, a first ground wire 12 is connected to a side opposite to the side where the first input wire 11 is connected.

The second IDT 20 is an input IDT connected to a second input wire 21 for inputting an input signal the same as that of the first input wire 11. In addition, in the second IDT 20, a second ground wire 22 is connected to a side opposite to the side where the second input wire 21 is connected.

The third IDT 30 is an output IDT connected to an output wire 31. In addition, in the third IDT 30, a third ground wire 32 is connected to a side opposite to the side where the output wire 31 is connected.

That is, the surface acoustic wave element 100 includes one output IDT and two input IDTs.

Hereinafter, although a surface acoustic wave element including one output IDT and two input IDTs is described, this is an example, and the number of IDTs included in the surface acoustic wave element, is not limited. The present invention may be applied, for example, to a surface acoustic wave element including one output IDT and four input IDTs.

The first input wire 11, the second input wire 21 and the output wire 31 are adjacent to each other and withdrawn in the same direction (in FIG. 1, they are withdrawn in the downward direction). This configuration intentionally generates capacitance (parasitic capacitance) between the first input wire 11 and the output wire 31 and between the second input wire 21 and the output wire 31 adjacent to each other. Values of the generated capacitance vary according to the shapes, materials and the like of the first input wire 11, the second input wire 21 and the output wire 31. That is, a designer or the like may adjust the capacitance values by changing the shapes, materials and the like of the first input wire 11, the second input wire 21 and the output wire 31 according to a design. The capacitance values between the first input wire 11 and the output wire 31 and between the second input wire 21 and the output wire 31 may be the same or different from each other, and the capacitance values can be designed according to an objective characteristic.

The first ground wire 12, the second ground wire 22 and the third ground wire 32 are withdrawn in the same direction (the upward direction in FIG. 1) and connected to the same ground.

The first electrode 41 and the second electrode 42 are, for example, electrodes formed to lace two metal conductors, which are capacitance patterns having capacitance.

The first electrode 41 is connected to the input wire 11 of the first IDT 10 and the output wire 31 of the third IDT 30. That is, the first electrode 41 applies capacitance between the first IDT 10 and the third IDT 30.

The second electrode 42 is connected to the input wire 21 of the second IDT 10 and the output wire 31 of the third IDT 30. That is, the second electrode 42 applies capacitance between the second IDT 20 and the third IDT 30.

The capacitance of the first electrode 41 and the second electrode 42 varies according to the width between the metal conductors, the shapes of the metal conductors or the like. That is, a designer or the like may adjust the capacitance values by changing the width between the metal conductors, the shapes of the metal conductors or the like of the first electrode 41 and the second electrode 42 according to a design. The capacitance values of the first electrode 41 and the second electrode 42 may be the same or different from each other.

In addition, the surface acoustic wave element 100 does not need to include both of the first electrode 41 and the second electrode 42 and only needs to include at least one of the first electrode 41 and the second electrode 42.

Figure 2:
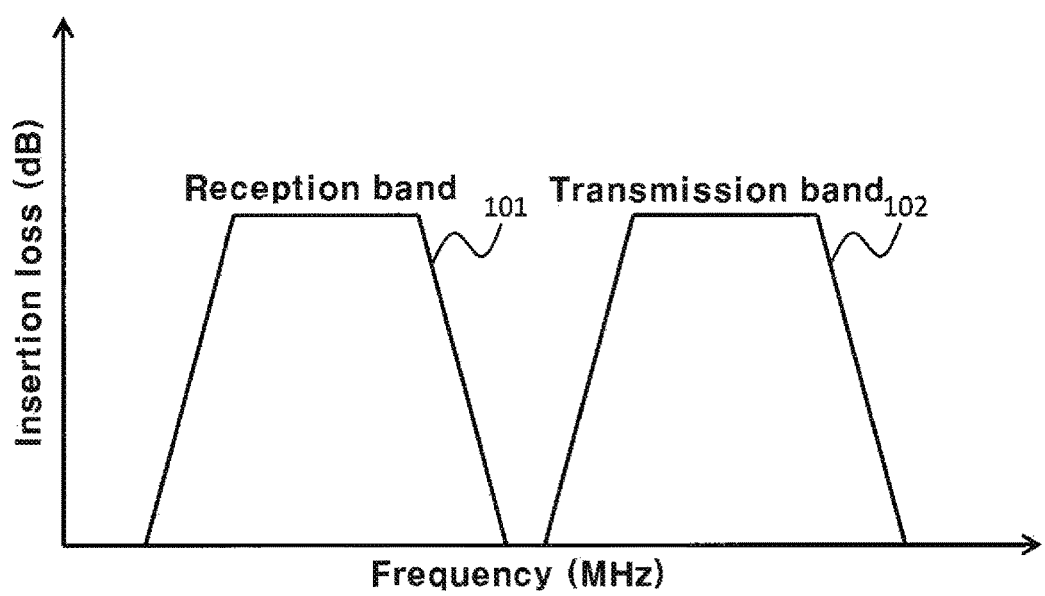
FIG. 2 is a mimetic view showing the relation of frequency characteristics of a reception band and a transmission band.

FIG. 2 is a mimetic view showing an example of the relation of frequency characteristics of a reception band and a transmission band of a surface acoustic wave element to which the present invention can be applied. In FIG. 2, the horizontal axis shows frequency MHz, and the vertical axis shows insertion loss dB, in which it is shown that the transmission band 102 has a frequency higher than that of the reception band 101.

When the reception band 101 and the transmission band 102 are in the relation of FIG. 2, it is regarded that the attenuation amount of the attenuation band of the high band side of the reception band 101 is required to be large. The present invention may increase the attenuation amount of the attenuation band of the high band side of the reception band 101 by applying the capacitance between the IDTs of the surface acoustic wave element.

Figure 3:
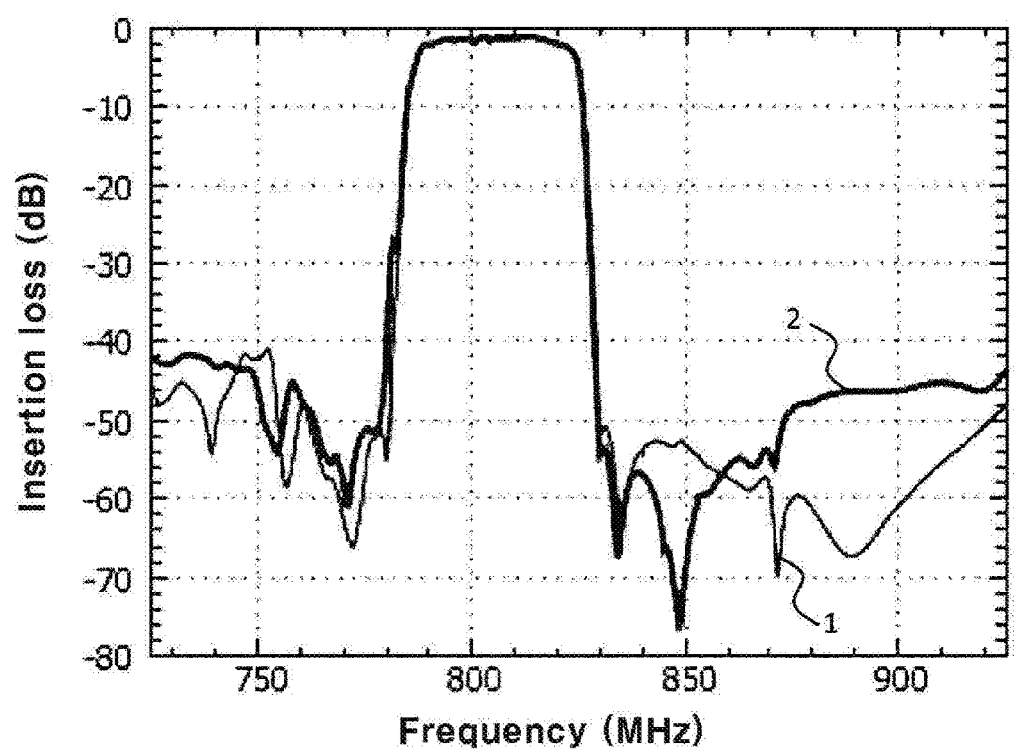
FIG. 3 is a graph showing the frequency characteristic of the reception band of a conventional surface acoustic wave element and the frequency characteristic of the reception band of a surface acoustic wave element related to the present invention.

FIG. 3 is a graph showing the frequency characteristic of the reception band of the surface acoustic wave element 100 related to the present invention and the frequency characteristic of the reception band of a general surface acoustic wave element. In addition, the conventional surface acoustic wave element is a surface acoustic wave element to which capacitance not applied. A first frequency characteristic 1 is the frequency characteristic of the conventional surface acoustic wave element, and a second frequency characteristic 2 is the frequency characteristic of the surface acoustic wave element 100, in which the horizontal axis shows frequency MHz, and the vertical axis shows insertion loss dB. In addition, in FIG. 3, the horizontal axis is in a range of 720 to 930 MHz, and the vertical axis is in a range of –80 to 0 dB.

As shown in FIG. 3, the surface acoustic wave element 100 has a reception band of about 780 to 830 MHz. In addition, the surface acoustic wave element 100 attenuates the frequency as much as about 26 dB in the attenuation band of a high band side of 840 to 350 MHz, compared with the conventional surface acoustic wave element. This is since that a resonance is generated in the attenuation band of the high band side of the reception band as capacitance is applied, and thus the insertion loss is suppressed. That is, the surface acoustic wave element 100 related to an embodiment of the present invention may obtain a steep and large attenuation characteristic in the attenuation band of the high band side of the reception band by applying capacitance to generate a resonance in the attenuation band of the high band side of the reception band.

In addition, although the surface acoustic wave element 100 has a reception band in a range of about 780 to 830 MHz, this is an example and does not limit the reception band of the surface acoustic wave element. The present invention can be applied to a surface acoustic wave element having a reception band in another frequency band.

Figure 4:
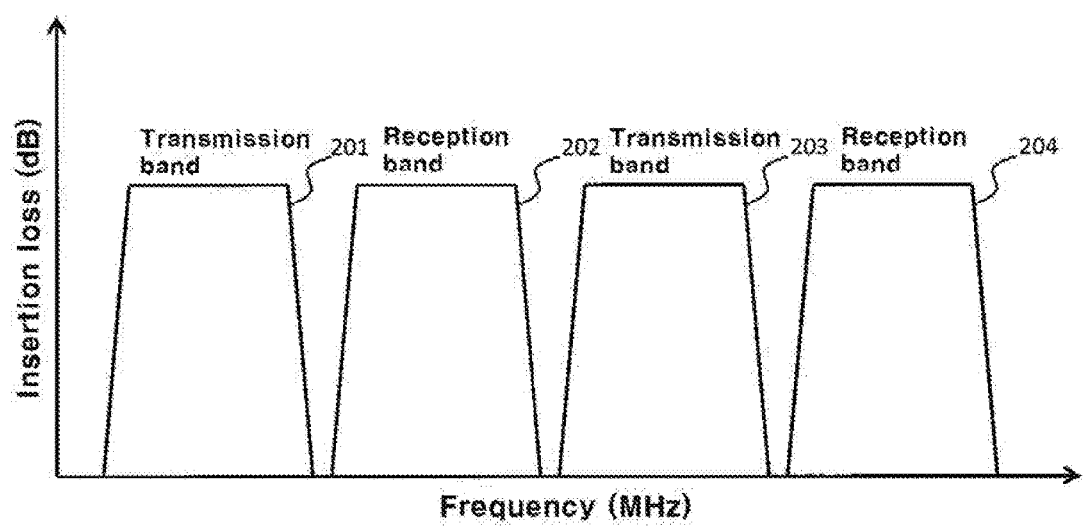
FIG. 4 is a mimetic view showing the relation of frequency characteristics of the reception bands and the transmission bands of two bands.

FIG. 4 is a mimetic view showing the relation of frequency characteristics when a communication using two or more bands is performed using one common antenna. FIG. 4 shows a communication band of two bands including a transmission band 201, a reception band 202, a transmission band 203 and a reception band 204. In addition, in FIG. 4, the horizontal axis shows frequency MHz, and the vertical axis shows insertion loss dB.

The reception band 202 exists in a frequency band between the transmission bands 201 and 202. In this case, it needs to steeply and highly attenuate the attenuation band of the low band side of the reception band 202, in addition to steeply and highly attenuate the attenuation band of the high band side. In the present invention, even in the case of FIG. 4, a steep and large attenuation characteristic in the attenuation band of the low band side of the reception band 202 can be obtained by applying capacitance to generate a resonance in the attenuation band of the low band side of the reception band 202.

In addition, since the surface acoustic wave element 100 may obtain a steep and large attenuation characteristic of low loss only by changing the shape of wiring or applying capacitance between IDTs, it is advantageous from the viewpoint of miniaturizing the device, compared with a conventional surface acoustic wave element.

1. Modifications of a First Embodiment 2-1. First Modification

Figure 5:
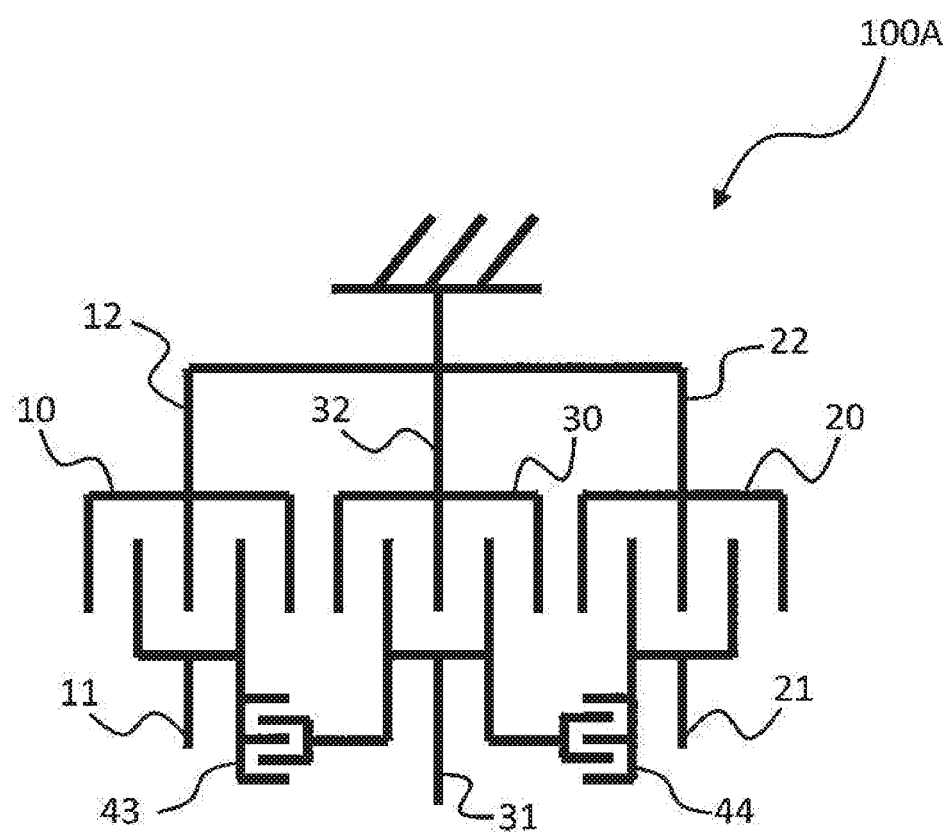
FIG. 5 is a mimetic view showing the configuration of an IDT related to a first modification of a first embodiment of the present invention.

FIG. 5 is a mimetic view showing the configuration of en IDT of a surface acoustic wave element 100A related to a first modification of the surface acoustic wave element 100 of the present invention.

The surface acoustic wave element 100A includes a first IDT 10, a second IDT 20, a third IDT 30, a first vertical IDT 43 and a second vertical IDT 44.

The surface acoustic wave element 100A is different from the surface acoustic wave element 100 in that the first vertical IDT 43 is connected between the first IDT 10 and the third IDT 30 and the second vertical IDT 44 is connected between the second IDT 20 and the third IDT 30.

The first vertical TOT 43 and the second vertical IDT 44 are IDTs forming an electrode in the vertical direction with respect to the propagation direction of a surface acoustic wave (i.e., vertical IDTs). That is, capacitance can be applied to the surface acoustic wave element 100 by connecting the vertical IDTs 43 and 44 as shown in FIG. 5, as well as an electrode configured of two metal conductors, between the first IDT 10 and the third IDT 30 and between the second IDT 20 and the third IDT 30.

Values of the capacitance of the first vertical IDT 43 and the second vertical IDT 44 vary according to a pitch width of the electrode, a logarithm of the electrode and the like. That is, a designer or the like may adjust the capacitance values by changing a pitch width of the electrode, a logarithm of the electrode and the like of the first vertical IDT 43 and the second vertical IDT 44 according to a design. The capacitance values of the first vertical IDT 43 and the second vertical IDT 44 may be the same or different from each other.

In addition, the surface acoustic wave element 100A does not need to include both of the first vertical IDT 43 and the second vertical IDT 44 and only needs to include at least one of the first vertical IDT 43 and the second vertical IDT 44.

2-2. Second Modification

Figure 6:
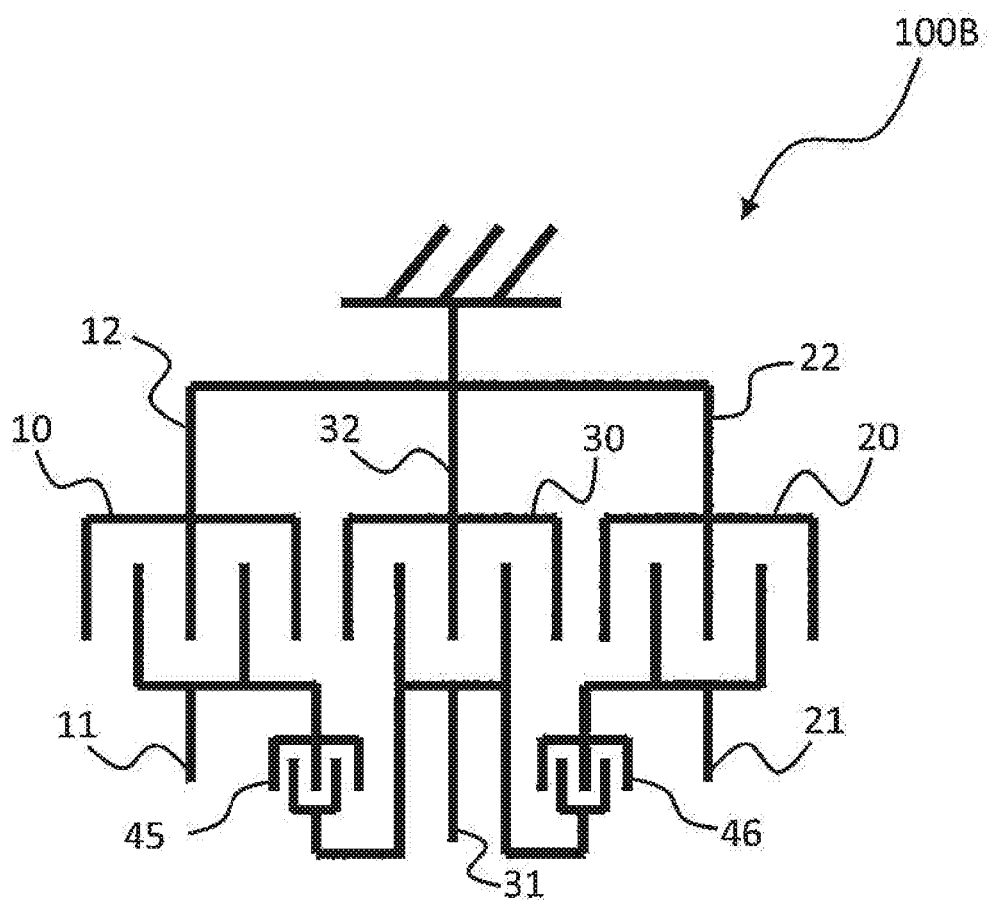
FIG. 6 is a mimetic view showing the configuration of an IDT related to a second modification of a first embodiment of the present invention.

FIG. 6 is a mimetic view showing the configuration of an IDT of a surface acoustic wave element 100B related to a second modification of the surface acoustic wave element 100 of the present invention.

The surface acoustic wave element 100A related to a second mollification includes a first IDT 10, a second IDT 20, a third IDT 30, a first parallel IDT 45 and a second parallel IDT 46.

The surface acoustic wave element 100B is different from the surface acoustic wave element 100 in that the first parallel IDT 45 is connected between the first IDT 10 and the third IDT 30 and the second parallel IDT 46 is connected between the second IDT 20 and the third IDT 30.

The first parallel IDT 45 and the second parallel IDT 46 are IDTs forming an electrode in the parallel direction with respect to the propagation direction of a surface acoustic wave (i.e., parallel IDTs).

Values of the capacitance of the first parallel IDT 45 and the second parallel IDT 46 vary according to a pitch width of the electrode, a logarithm of the electrode and the like. That is, a designer or the like may adjust the capacitance values by changing a pitch width of the electrode, a logarithm of the electrode and the like of the first parallel IDT 45 and the second parallel IDT 46 according to a design. The capacitance values of the first parallel IDT 45 and the second parallel IDT 46 may be the same or different from each other.

In addition, the surface acoustic wave element 100B does not need to include both of the first parallel IDT 45 and the second parallel IDT 46 and only needs to include at least one of the first parallel IDT 45 and the second parallel IDT 46.

2-3. Third Modification

Figure 7:
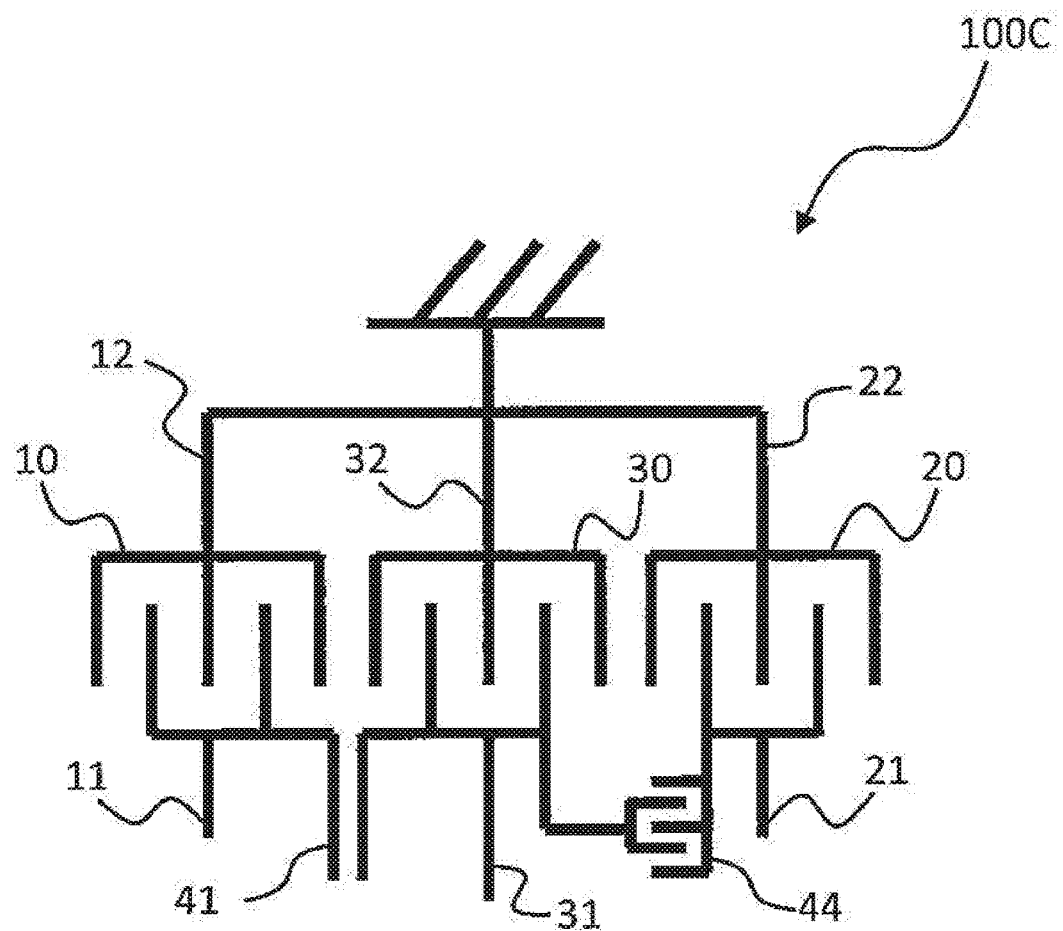
FIG. 7 is a mimetic view showing the configuration of an IDT related to a third modification of a first embodiment of the present invention.

FIG. 7 is a mimetic view showing the configuration of an IDT of a surface acoustic wave element 100C, which is a third modification of the surface acoustic wave element 100 of the present invention.

The surface acoustic wave element 100C includes a first IDT 10, a second IDT 20, a third IDT 30, a first electrode 41 and a second vertical IDT 44.

The surface acoustic wave element 100C is different from the surface acoustic wave element 100 in that although the first electrode 41 is connected between the first IDT 10 and the third IDT 30, the second vertical IDT 44 is connected between the second IDT 20 and the third IDT 30.

That is, capacitance patterns of different shapes may be connected between the first IDT 10 and the third IDT 30 and between the second IDT 20 and the third IDT 30. That is, in the surface acoustic wave element 100C, two connected capacitance patterns can be configured by freely combining the first electrode 41, the second electrode 42, the first vertical IDT 43, the second vertical IDT 44, the first parallel IDT 45 and the second parallel IDT 46 according to a design.

In addition, although the first electrode 41, the second electrode 42, the first vertical IDT 43, the second vertical IDT 44, the first parallel IDT 45 and the second parallel IDT 46 are described as shapes of capacitance patterns, these are examples and do not limit the present invention. In the present, invention, if a shape of a capacitance pattern is a shape which can apply capacitance to the surface acoustic wave element, the shape may be different from the shapes described above.

Accordingly, even the surface acoustic wave elements 100A to 100C may obtain a steep and large attenuation characteristic in the attenuation band of the high band side of the reception band by applying capacitance to generate a resonance in the attenuation band of the high band side of the reception band. In addition, since even the surface acoustic wave elements 100A to 100C may obtain a steep and large attenuation characteristic of low loss only by changing the shape of wiring or applying capacitance between IDTs, it is advantageous from the viewpoint of miniaturizing the device, compared with a conventional surface acoustic wave element.

3. Second Embodiment

Figure 8:
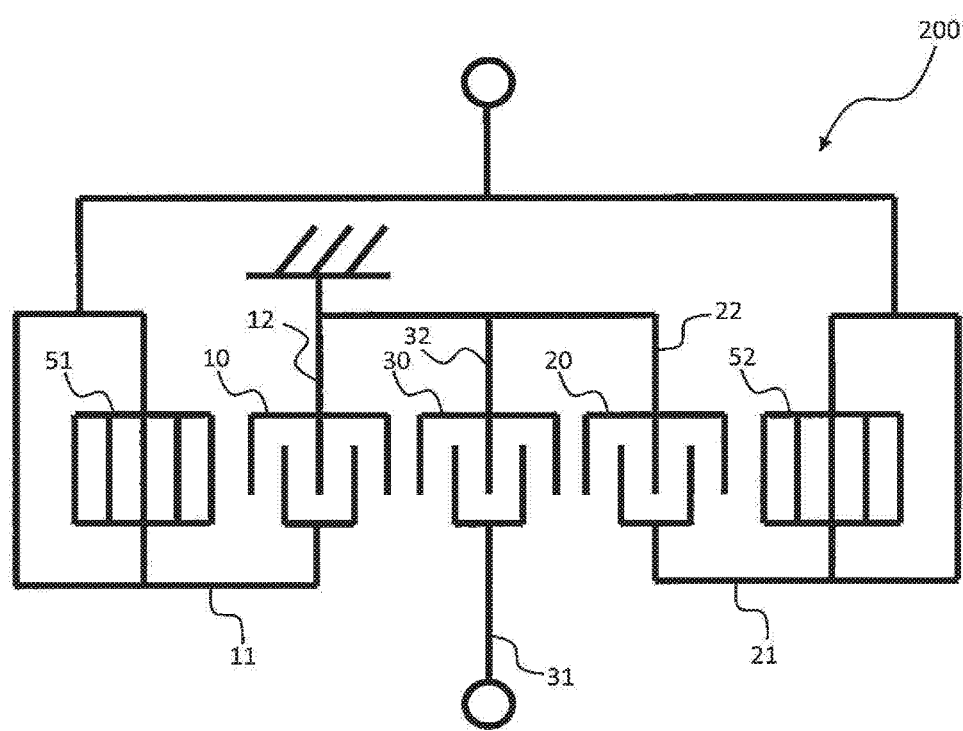
FIG. 8 is a mimetic view showing the configuration of a surface acoustic wave element related to a second embodiment of the present invention.

FIG. 8 is a mimetic view showing the configuration of a surface acoustic wave element 200 related to a second embodiment of the present invention.

The surface acoustic wave element 200 includes a first IDT 10, a second IDT 20, a third IDT 30, a first reflector 51 and a second reflector 52.

The first IDT 10 is an input IDT connected to a first input wire 11 for inputting an input signal. In addition, in the first IDT 10, a first ground wire 12 is connected to a side opposite to the side where the first input wire 11 is connected.

The second IDT 20 is an input IDT connected to a second input wire 21 for inputting an input signal the same as that of the first input wire 11. In addition, in the second IDT 20, a second ground wire 22 is connected to a side opposite ho the side where the second input wire 21 is connected.

The third IDT 30 is an output IDT connected to an output wire 31. In addition, in the third IDT 30, a third ground wire 32 is connected to a side opposite to the side where the output wire 31 is connected.

That is, the surface acoustic wave element 100 includes one output IDT and two input IDTs.

Hereinafter, although a surface acoustic wave element including one output IDT and two input IDTs is described, this is an example, and the number of IDTs included in the surface acoustic wave element is not limited. The present invention may be applied, for example, to a surface acoustic wave element including one output IDT and four input IDTs.

The first input wire 11, the second input wire 21 and the output wire 31 are adjacent to each other and withdrawn in the same direction (in FIG. 8, they are withdrawn in the downward direction). This configuration intentionally generates capacitance (parasitic capacitance) between the first input wire 11 and the output wire 31 and between the second input wire 21 and the output wire 31 adjacent to each other. Values of the generated capacitance vary according to the shapes, materials and the like of the first input wire 11, the second input wire 21 and the output wire 31. That is, a designer or the like may adjust the capacitance values by changing the shapes, materials and the like of the first input wire 11, the second input wire 21 and the output wire 31 according to a design. The capacitance values between the first input wire 11 and the output wire 31 and between the second input wire 21 and the output wire 31 may be the same or different from each other, and the capacitance values can be designed according to an objective characteristic.

The first ground wire 12, the second ground wire 22 and the third ground wire 32 are withdrawn in the same direction (the upward direction in FIG. 8) and connected to the same ground.

The first reflector 51 and the second reflector 52 are installed to insert the first IDT 10, the second IDT 20 and the third IDT 30 according to the propagation direction of a surface acoustic wave. In addition, the first input wire 11 is connected to the first reflector 51, and the second input wire 21 is connected to the second reflector 52.

Specifically, the first input wire 11 is connected to the first reflector 51 to generate capacitance between the output wire 31 and the first reflector 51, and the second input wire 21 is connected to the second reflector 52 to generate capacitance between the output wire 31 and the second reflector 52.

That is, in the surface acoustic wave element 200, capacitance is generated between the output wire 31 and the first reflector 51 and between the output wire 31 and the second reflector 52.

A value of the capacitance generated between the output wire 31 and the first reflector 51 varies according to the shape of the output wire 31, a logarithm of the electrode of the first reflector 51, a pitch width of the first reflector 51 and the like. That is, a designer or the like may adjust the capacitance value by changing the shape of the output wire 31, the logarithm of the electrode of the first reflector 51, the pitch width of the first reflector 51 and the like according to a design.

In the same manner, a value of the capacitance generated between the output wire 31 and the second reflector 52 varies according to the shape of the output wire 31, a logarithm of the electrode of the second reflector 52, a pitch width of the second reflector 52 and the like. That is, a designer or the like may adjust the capacitance value by changing the shape of the output wire 31, the logarithm of the electrode of the second reflector 52, the pitch width of the second reflector 52 and the like according to a design.

The value of the capacitance generated between the output wire 31 and the first reflector 51 and the value of the capacitance generated between the output wire 31 and the second reflector 52 may be the same or different from each other.

Accordingly, the surface acoustic wave element 200 may obtain a steep and large attenuation characteristic of low loss in the high band side of the reception band by applying capacitance. In addition, since the surface acoustic wave element 200 may obtain a steep and large attenuation characteristic of low loss only by changing the shape of wiring or applying capacitance between IDTs, it is advantageous from the viewpoint of miniaturizing the device, compared with a conventional surface acoustic wave element.

4. Modifications of a Second Embodiment 4-1. First Modification

Figure 9:
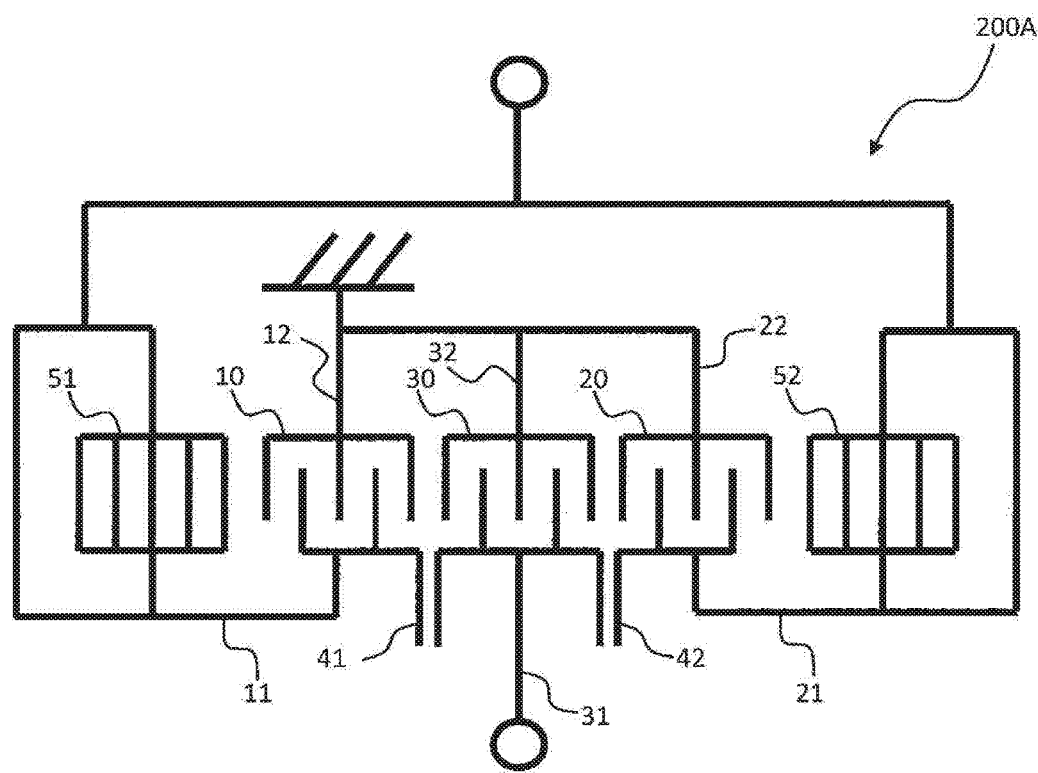
FIG. 9 is a mimetic view showing the configuration of an IDT related to a first modification of a second embodiment of the present invention.

FIG. 9 is a mimetic view showing the configuration of a surface acoustic wave element 200A, which is a first modification of the surface acoustic wave element 200.

The surface acoustic wave element 200A includes a first IDT 10, a second IDT 20, a third IDT 30, a first electrode 41, a second electrode 42, a first reflector 51 and a second reflector 52.

The surface acoustic wave element 200A is different from the surface acoustic wave element 200 in that the first electrode 41 is connected between the first IDT 10 and the third IDT 30 and the second electrode 42 is connected between the second IDT 20 and the third IDT 30.

That is, in the surface acoustic wave element 200A, capacitance is applied between the first IDT 10 and the third IDT 30 and between the second IDT 20 and the third IDT 30 by the first electrode 41 and the second electrode 42.

Accordingly, the surface acoustic wave element 200A may obtain a steep and large attenuation characteristic of low loss in the high band side of the reception band by changing the capacitance values of the first electrode 41 and the second electrode 42.

4-2. Second Modification

Figure 10:
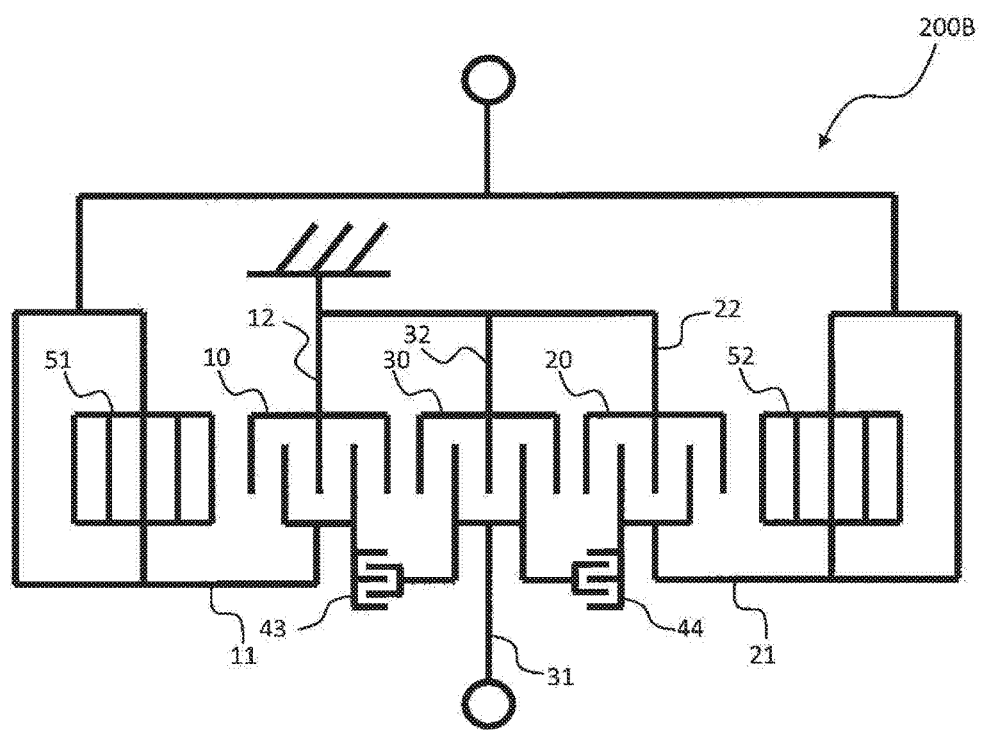
FIG. 10 is a mimetic view showing the configuration of an IDT related to a second modification of a second embodiment of the present invention.

FIG. 10 is a mimetic view showing the configuration of a surface acoustic wave element 200B, which is a second modification of the surface acoustic wave element 200.

The surface acoustic wave element 200B includes a first IDT 10, a second IDT 20, a third IDT 30, a first vertical IDT 43, a second vertical IDT 44, a first reflector 51 and a second reflector 52.

The surface acoustic wave element 200B is different from the surface acoustic wave element 200 in that the first vertical IDT 43 is connected between the first IDT 10 and the third IDT 30 and the second vertical IDT 44 is connected between the second IDT 20 and the third IDT 30.

That is, in the surface acoustic wave element 200B, compared with the surface acoustic wave element 200, capacitance is applied between the first IDT 10 and the third IDT 30 and between the second IDT 20 and the third IDT 30.

Accordingly, the surface acoustic wave element 200B may obtain a steep and large attenuation characteristic of low loss in the high band side of the reception band by changing the capacitance values of the first vertical IDT 43 and the second vertical IDT 44.

4-3. Third Modification

Figure 11:
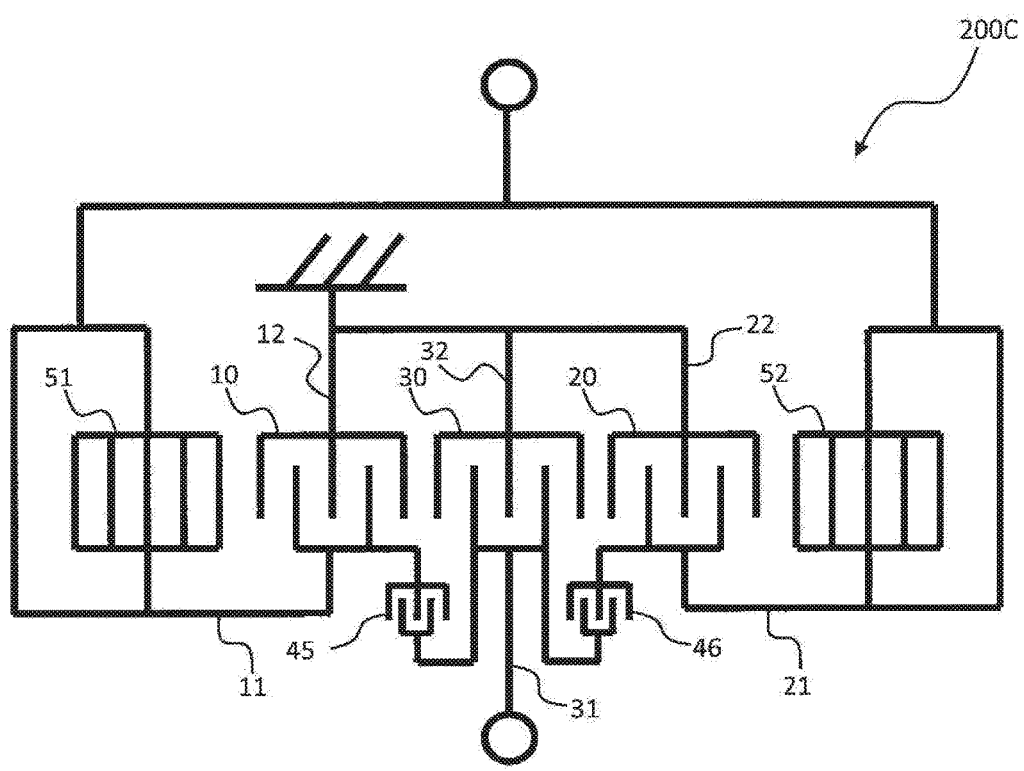
FIG. 11 is a mimetic view showing the configuration of an IDT related to a third modification of a second embodiment of the present invention.

FIG. 11 is a mimetic view showing the configuration of a surface acoustic wave element 200C, which is a third modification of the surface acoustic wave element 200.

The surface acoustic wave element 200C includes a first IDT 10, a second IDT 20, a third IDT 30, a first parallel IDT 45, a second parallel IDT 46, a first reflector 51 and a second reflector 52.

The surface acoustic wave element 200C is different from the surface acoustic wave element 200 in that the first parallel IDT 45 is connected between the first IDT 10 and the third IDT 30 and the second parallel IDT 46 is connected between the second IDT 20 and the third IDT 30.

That is, in the surface acoustic wave element 200C, compared with the surface acoustic wave element 200, capacitance is applied between the first IDT 10 and the third IDT 30 and between the second IDT 20 and the third IDT 30.

Accordingly, the surface acoustic wave element 200C may obtain a steep and large attenuation characteristic of low loss in the high band side of the reception band by changing the capacitance values of the first parallel IDT 45 and the second parallel IDT 46.

4-4. Fourth Modification

Figure 12:
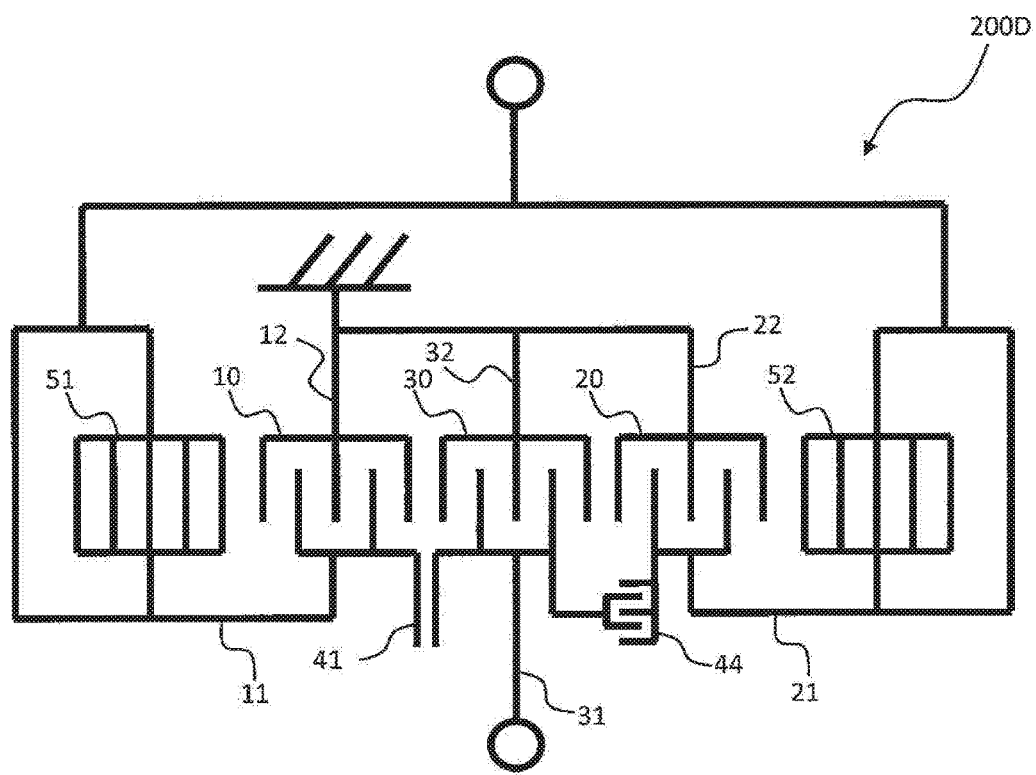
FIG. 12 is a mimetic view showing the configuration of an IDT related to a fourth modification of a second embodiment of the present invention.

FIG. 12 is a mimetic view showing the configuration of a surface acoustic wave element 200D, which is a fourth modification of the surface acoustic wave element 200.

The surface acoustic wave element 200D includes a first IDT 10, a second IDT 20, a third IDT 30, a first electrode 41, a second vertical IDT 44, a first reflector 51 and a second reflector 52.

The surface acoustic wave element 200D is different from the surface acoustic wave element 200 in that, the first electrode 41 is connected between the first IDT 10 and the third IDT 30 and the second vertical IDT 44 is connected between the second IDT 20 and the third IDT 30.

That is, in the surface acoustic wave element 200D, capacitance patterns of different shapes may be connected between the first IDT 10 and the third IDT 30 and between the second IDT 20 and the third IDT 30. In addition, in the surface acoustic wave element 200D, two connected capacitance patterns can be configured by freely combining the first electrode 41, the second electrode 42, the first vertical IDT 43, the second vertical IDT 44, the first parallel IDT 45 and the second parallel IDT 46 according to a design. Here, the capacitance values of the capacitance patterns connected between the first IDT 10 and the third IDT 30 and between the second IDT 20 and the third IDT 30 may be the battle or different from each other.

In addition, in the present invention, although the first electrode 41, the second electrode 42, the first vertical IDT 43, the second vertical IDT 44, the first parallel IDT 45 and the second parallel IDT 46 are described as capacitance patterns for applying capacitance, these are examples and do not limit the present invention. In the present invention, if a shape of a capacitance pattern is a shape which can apply capacitance to the surface acoustic wave element, the shape may be different from the shapes described above.

Accordingly, even the surface acoustic wave elements 200A to 200D may obtain a steep and large attenuation characteristic in the attenuation band of the high band side of the reception band by applying capacitance ho generate a resonance, in the attenuation band of the high band side of the reception band. In addition, since even the surface acoustic wave elements 200A to 200D may obtain a steep and large attenuation characteristic of low loss only by changing the shape of wiring or applying capacitance between IDTs, it is advantageous from the viewpoint of miniaturizing the device, compared with a conventional surface acoustic wave element.

5. Third Embodiment

The surface acoustic wave device related to a third embodiment of the present invention is a surface acoustic wave device configuring a reception side of a duplexer mounted on an antenna sharing device or the like.

Figure 13:
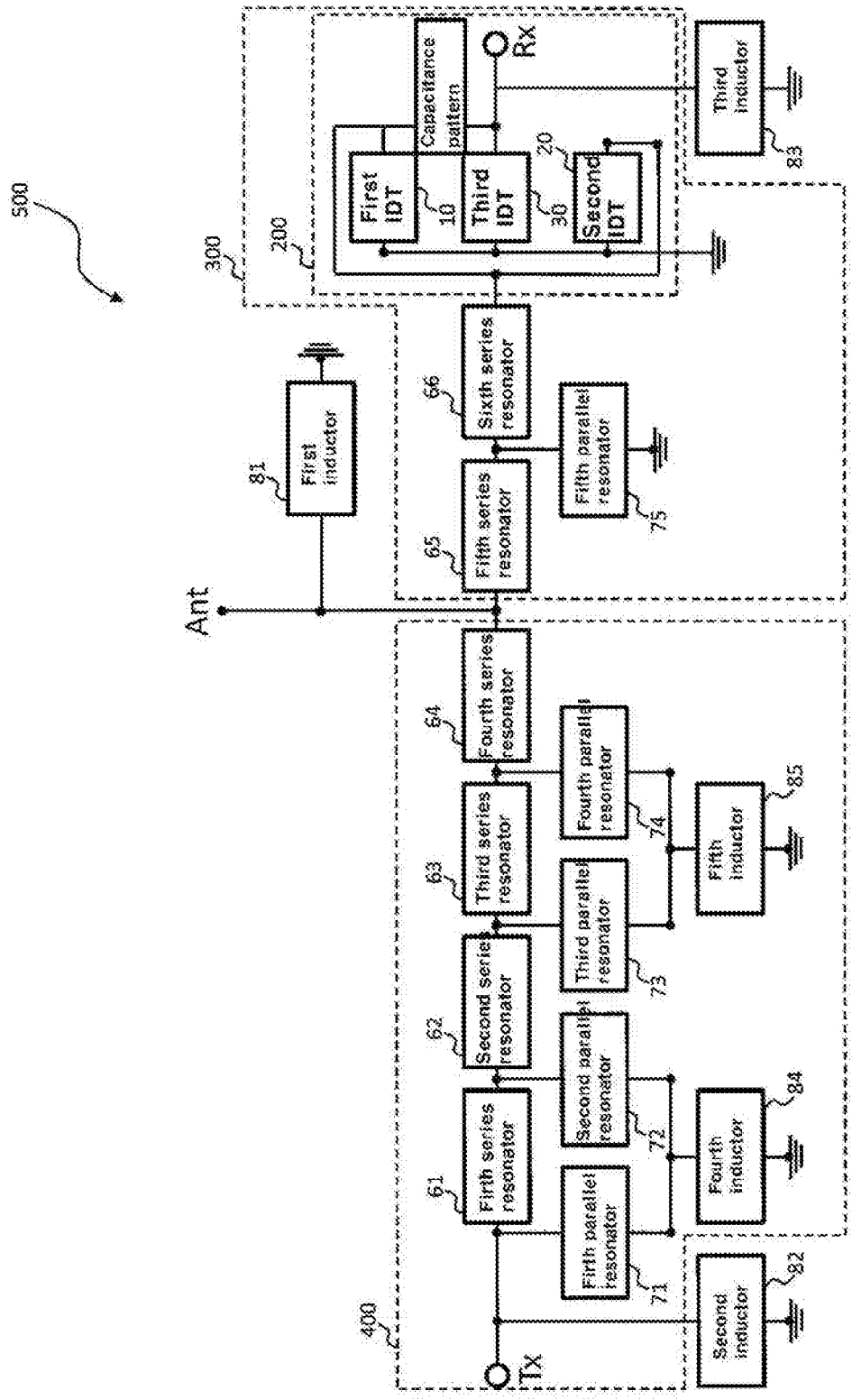
FIG. 13 is a block diagram showing the configuration of a duplexer related to a third embodiment.

Here, an example of a duplexer 500 applying the present invention will be described with reference to FIG. 13.

The duplexer 500 includes a reception side surface acoustic wave device 300 and a transmission side surface acoustic wave device 400, and both of them are connected to an antenna (Ant) terminal. In addition, a first inductor 81 is connected to the Ant terminal of the duplexer 500, a second inductor 82 is connected to the transmission side Tx terminal, and a third inductor 83 is connected to the reception side Rx terminal. The first to third inductors 81 to 83 may be configured of, for example, general inductors.

The reception side surface acoustic wave device 300 includes a surface acoustic wave element 200, a fifth series resonator 65, a sixth series resonator 56 and a fifth parallel resonator 75. In the surface acoustic wave device 300, the surface acoustic wave element 200 has a configuration of connecting a capacitance pattern between a first IDT 10 and a third IDT 30.

The fifth series resonator 65, the sixth series resonator 66 and the fifth parallel resonator 75 may be configured of, for example, general SAW resonators of one port. The fifth series resonator 65, the sixth series resonator 66 and the fifth parallel resonator 75 are connected in the shape of a ladder.

That is, the surface acoustic wave device 300 is a surface acoustic wave device connected with a SAW resonator coupled to the surface acoustic wave element 200 of the second embodiment in the shape of a ladder.

In addition, the fifth series resonator 65, the sixth series resonator 66 and the fifth, parallel resonator 75 do not limit the number of SAW resonators connected to the surface acoustic wave element 200. In the present invention, the number of SAW resonators connected to the surface acoustic wave element 200 is not specially limited, and the surface acoustic wave device 300 may be configured, for example, by connecting only the fifth series resonator 65 to the surface acoustic wave element 200 according to a design.

In addition, although it is described below, since the surface acoustic wave device 300 is a surface acoustic wave device used by the reception side of the duplexer 500, the surface acoustic wave device 300 has a steep and large attenuation characteristic even in an isolation from the Tx terminal to the Rx terminal.

The transmission side surface acoustic wave device 400 includes a first series resonator 61, a second series resonator 62, a third series resonator 63, a fourth series resonator 64, a first parallel resonator 71, a second parallel resonator 72, a third parallel resonator 73, a fourth parallel resonator 74, a fourth inductor 84 and a fifth inductor 85.

The first to fourth series resonators 61 to 64 may be configured of, for example, general SAW resonators of one port. In the same manner, the first to fourth parallel resonators 71 to 74 may be configured of, for example, general SAW resonators of one port. The fourth inductor 84 and the fifth inductor 35 may be configured of general inductors.

The transmission side surface acoustic wave device 400 is a ladder type surface acoustic wave device in which the first to fourth series resonators 61 to 64, the first to fourth parallel resonators 71 to 74, the fourth inductor 84 and the fifth inductor 85 are combined in the shape of a ladder.

Figure 14:
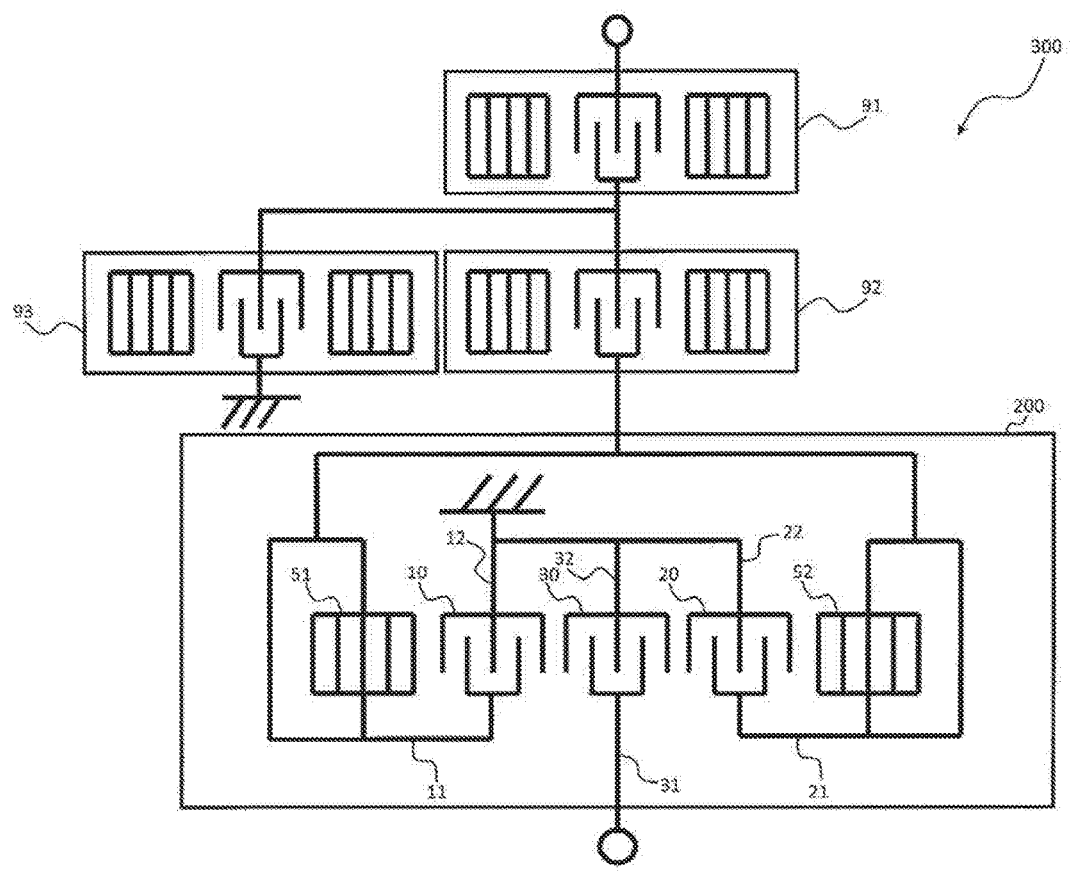
FIG. 14 is a mimetic view showing the configuration of a surface acoustic wave element related to a third embodiment of the present invention.

FIG. 14 is a mimetic view showing the specific configuration of the surface acoustic wave device 300.

The surface acoustic wave device 300 includes a surface acoustic wave element 200, a first resonator 91, a second resonator 92 and a third resonator 93.

The first resonator 91, the second resonator 92 and the third resonator 93 may be configured of, for example, SAW resonators of one port. In FIG. 14, the first resonator 91, the second resonator 92 and the third resonator 93 connected in the shape of a ladder are connected to the surface acoustic wave element 200. In addition, an described above, the first resonator 91, the second resonator 92 and the third resonator 93 are not limited to the SAW resonators connected to the surface acoustic wave element 200. The surface acoustic wave device 300 may be a configuration, for example, connecting only the first resonator 91 to the surface acoustic wave element 200.

Since the surface acoustic wave device 300 is mounted on an antenna sharing device, in addition to the steep and large attenuation characteristic of the high band side of the reception band, it needs to have a steep and large attenuation characteristic for the isolation from the transmission side to the surface acoustic wave element 200.

Figure 15:
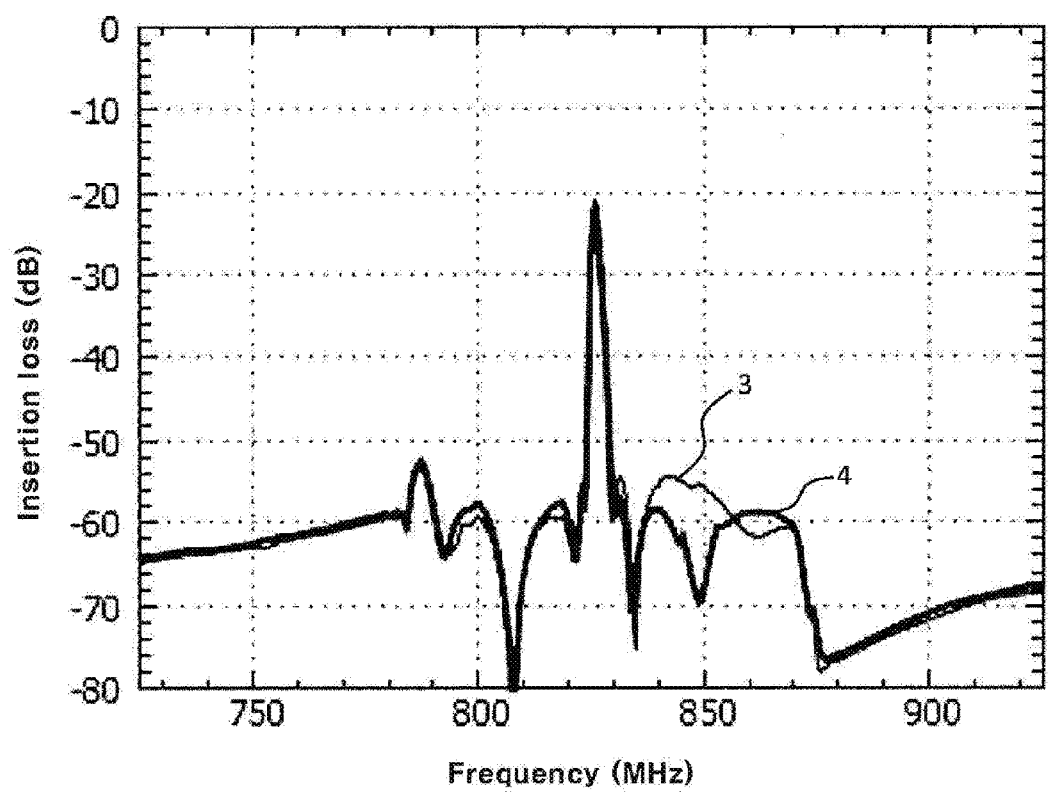
FIG. 15 is a graph showing the isolation characteristic of a conventional surface acoustic wave element and the isolation characteristic of a surface acoustic wave element related to a third embodiment.

FIG. 15 is a graph showing the isolation characteristics of a surface acoustic wave device to which capacitance is not applied and the surface acoustic wave device 300 related to the present invention to which capacitance is applied. In FIG. 15, a first isolation characteristic 3 is an isolation characteristic of the surface acoustic wave device to which capacitance is not applied, and a second isolation characteristic 4 is an isolation characteristic of the surface acoustic wave device 300 related to the present invention, in which the horizontal axis shows frequency MHz, and the vertical axis shows insertion loss dB.

Comparing the first isolation characteristic 3 and the second isolation characteristic 4, the second isolation characteristic 4 has a steep and large attenuation characteristic at the high band side of about 840 to 850 MHz. This is since that insertion loss is suppressed in the isolation since capacitance is applied to the surface acoustic wave device 200.

Figure 16:
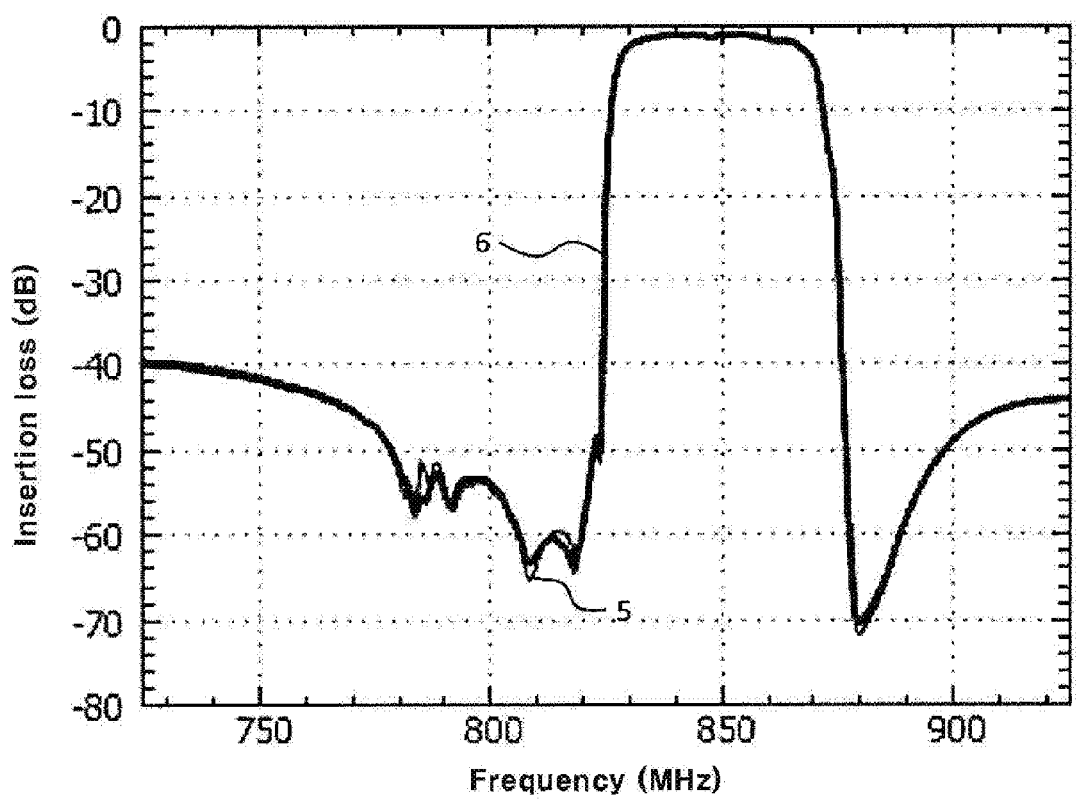
FIG. 16 is a graph showing the frequency characteristic of the transmission band of a conventional duplexer and the frequency characteristic of the transmission band of a duplexer related to a third embodiment.

FIG. 16 is a graph showing the frequency characteristics of the transmission sides of a surface acoustic wave device to which capacitance is not applied and the surface acoustic wave device 300 related to the present invention. In FIG. 16, a first transmission side frequency characteristic 5 is a frequency characteristic of the transmission side of the surface acoustic wave device to which capacitance is not applied, and a second transmission side frequency characteristic 6 is a frequency characteristic of the transmission side of the surface acoustic wave device 300 related to the present invention, in which the horizontal axis shows frequency MHz, and the vertical axis shows insertion loss dB.

Referring to FIG. 16, most part of the first transmission side frequency characteristic 5 is overlapped with the second transmission side frequency characteristic 6, and it shows that although capacitance is applied to the surface acoustic wave device 300 of the reception side, it does not affect the transmission side. In addition, since the frequency characteristic of the reception side is the same as that of FIG. 3, description thereof will be omitted.

That is, the surface acoustic wave device 300 related to the present invention has a steep and large attenuation characteristic even in the isolation characteristic, as well as in the high band side of the reception band.

6. Modifications of a Third Embodiment

6-1. First Modification

Figure 17:
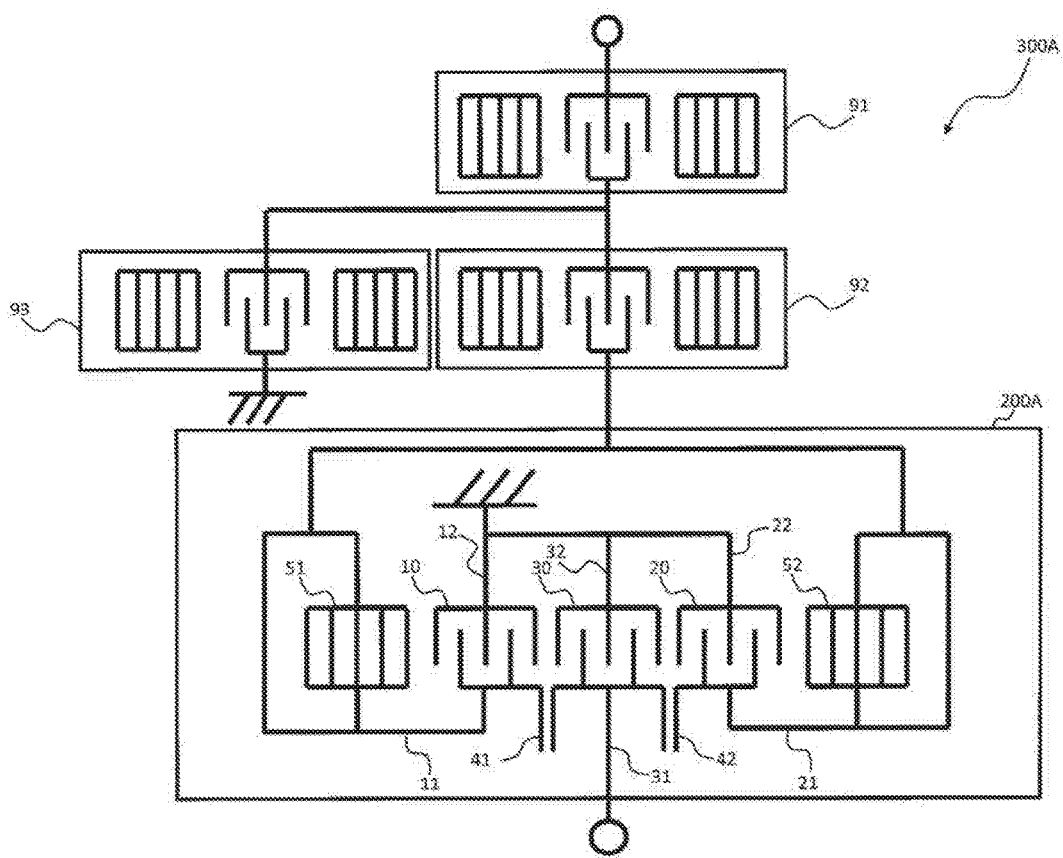
FIG. 17 is a mimetic view showing the configuration of a surface acoustic wave element related to a first modification of a third embodiment of the present invention.
Figure 18:
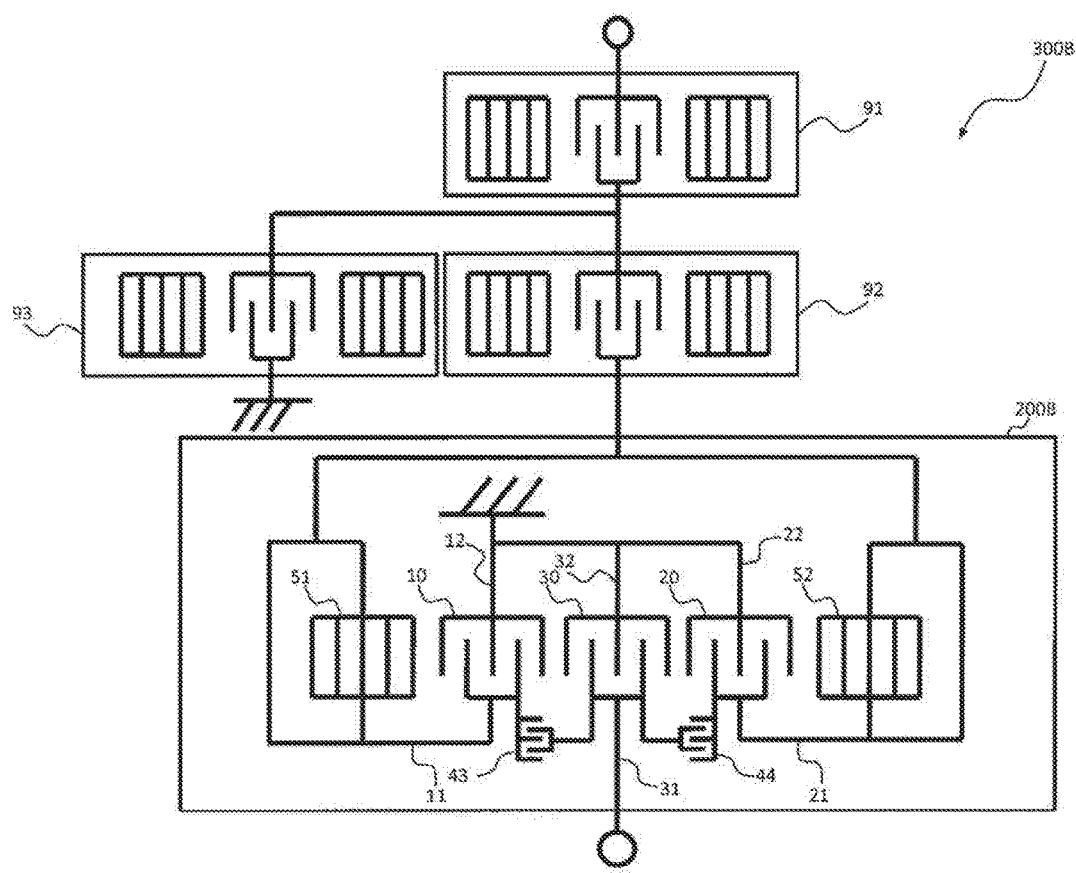

FIG. 17 is a mimetic view showing the configuration of a surface acoustic wave device 300A related to a first modification of the surface acoustic wave device 300.

The surface acoustic wave device 300A is different from the surface acoustic wave device 300 described above in that the surface acoustic wave element 200A is connected to the first resonator 91, the second resonator 92 and the third resonator 93.

Since capacitance is applied to the surface acoustic wave element 200A, the surface acoustic wave device 300A has a steep and large attenuation characteristic even in the isolation characteristic, as well as in the high band side of the reception band.

6-2. Second Modification

FIG. 16 is a mimetic view showing the configuration of a surface acoustic wave device 300B related to a second modification of the surface acoustic wave device 300.

The surface acoustic wave device 300B is different from the surface acoustic wave device 300 described above in that the first resonator 91, the second resonator 92, the third resonator 93 and the surface acoustic wave element 200B are connected.

Since capacitance is applied to the surface acoustic wave element 200B, the surface acoustic wave device 300B has a steep and large attenuation characteristic even in the isolation characteristic, as well as in the high band side of the reception band.

6-3. Third Modification

Figure 19:
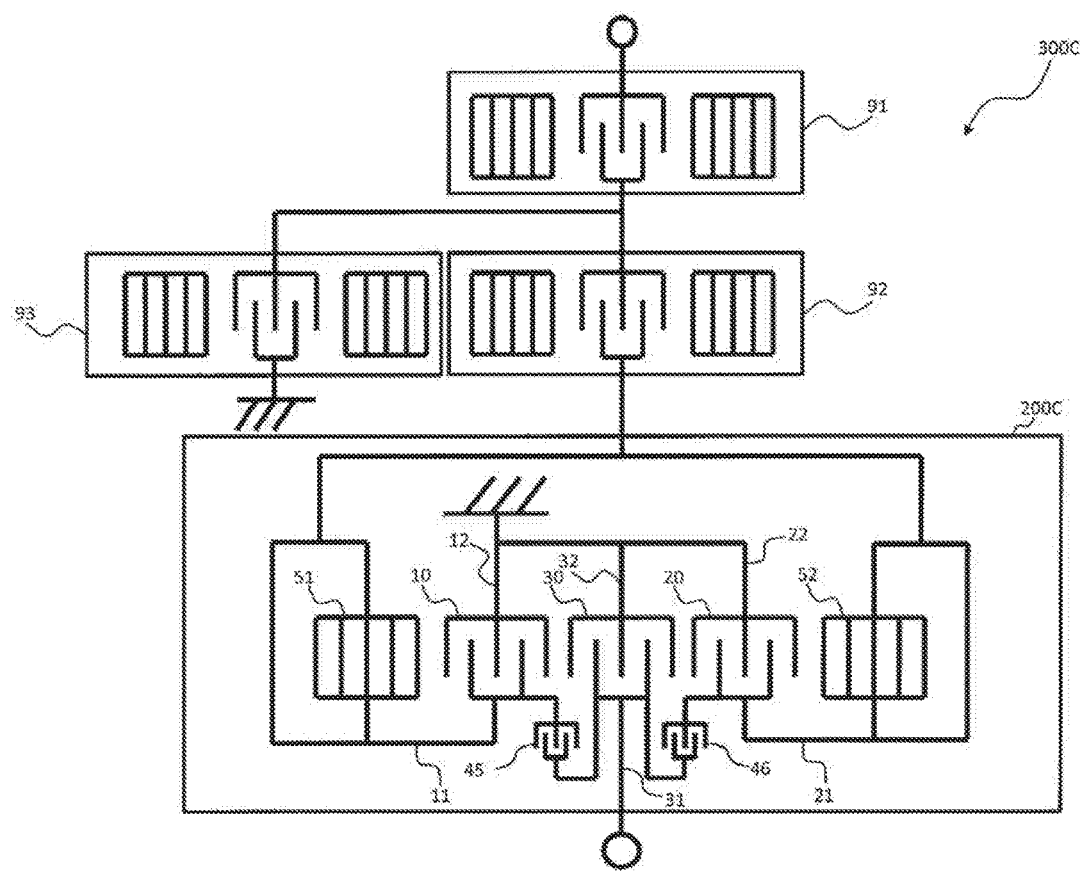
FIG. 19 is a mimetic view showing the configuration of a surface acoustic wave element related to a third modification of a third embodiment of the present invention.

FIG. 19 is a mimetic view showing the configuration of a surface acoustic wave, device 300C, which is a third modification of the surface acoustic wave device 300.

The surface acoustic wave device 300C is different from the surface acoustic wave device 300 described above in that the surface acoustic wave element 200C is connected to the first resonator 91, the second resonator 92 and the third resonator 93.

Since capacitance is applied to the surface acoustic wave element 200C, the surface acoustic wave device 300C has a steep and large attenuation characteristic even in the isolation characteristic, as well as in the high band side of the reception band.

6-4. Fourth Modification

Figure 20:
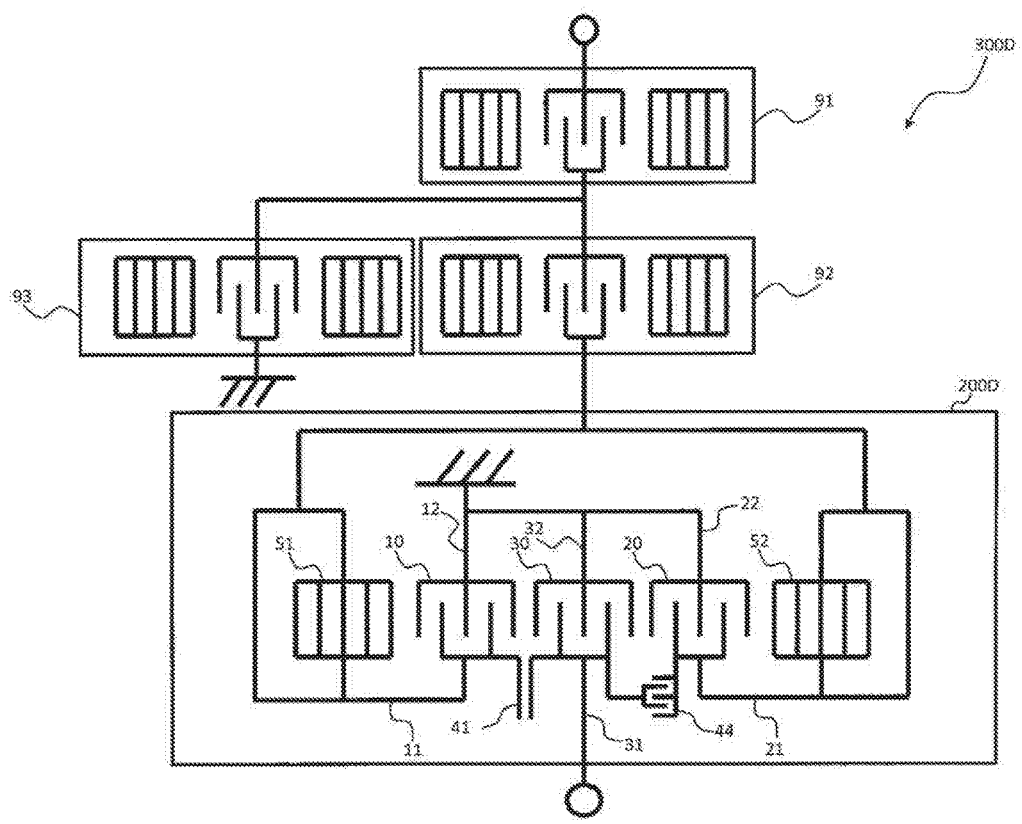
FIG. 20 is a mimetic view showing the configuration of a surface acoustic wave element related to a fourth modification of a third embodiment of the present invention.

FIG. 20 is a mimetic view showing the configuration of a surface acoustic wave device 300D, which is a fourth modification of the surface acoustic wave device 300.

The surface acoustic wave device 300D is different from the surface acoustic wave device 300 described above in that the surface acoustic wave element 200D is connected to the first resonator 91, the second resonator 92 and the third resonator 93.

Since capacitance is applied to the surface acoustic wave element 200D, the surface acoustic wave device 300D has a steep and large attenuation characteristic even in the isolation characteristic, as well as in the high band side of the reception band.

According to the present invention, a steep and large attenuation characteristic of low loss can be obtained without being limited to a DMS filter.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A surface acoustic wave (SAW) element comprising:
   a first input wire;
   a first IDT connected to the first input wire;
   a second input wire;
   a second IDT connected to the second input wire;
   an output wire; and
   a third IDT connected to the output wire and installed between the first IDT and the second IDT,
   wherein the first input wire, the second input wire and the output wire are adjacent to each other and withdrawn in a same direction, and a capacitance pattern for applying capacitance is connected at least either between the first IDT and the third IDT or between the second IDT and the third IDT, and
   wherein the capacitance pattern is determined by a resonance point which generates a resonance in an attenuation band or a resonance point which generates a resonance in an attenuation band of a high band side of a pass band.

2. The SAW element according to claim 1, wherein the capacitance pattern is any one of an electrode arranged to be opposed to two metal conductors, an IDT forming an electrode in a direction vertical to a propagation direction of a surface acoustic wave, and an IDT forming an electrode in a direction parallel to the propagation direction of the surface acoustic wave.

3. The SAW element according to claim 1, wherein the pass band is a reception band of a reception side.

4. A surface acoustic wave element comprising:
a first input wire;
a first IDT connected to the first input wire;
a second input wire;
a second IDT connected to the second input wire;
an output wire;
a third IDT connected to the output wire and installed between the first IDT and the second IDT; and
a first reflector and a second reflector installed on both sides of the first to third IDTs,
wherein the first input wire, the second input wire and the output wire are adjacent to each other and withdrawn in a same direction, and the first reflector is connected to the first input wire, and the second reflector is connected to the second input wire,
wherein a capacitance pattern for applying capacitance is connected at least either between the first IDT and the third IDT or between the second IDT and the third IDT, and
wherein the capacitance pattern is determined by a resonance point which generates a resonance in an attenuation band or a resonance point which generates a resonance in an attenuation band of a high band side of a pass band.

5. The SAW element according to claim 4, wherein the capacitance pattern is any one of an electrode arranged to be opposed to two metal conductors, a first vertical IDT forming an electrode in a direction vertical to a propagation direction of a surface acoustic wave, and a second vertical IDT forming an electrode in a direction parallel to the propagation direction of the surface acoustic wave.

6. The SAW element according to claim 4, wherein the first reflector is connected to the first input wire and the second reflector is connected to the second input wire to generate capacitance.

7. The SAW element according to claim 4, wherein the pass band is a reception band.

8. A surface acoustic wave device comprising a surface acoustic wave element including:
a first input wire;
a first IDT connected to the first input wire;
a second input wire;
a second IDT connected to the second input wire;
an output wire; and
a third IDT connected to the output wire and installed between the first IDT and the second IDT,
wherein the first input wire, the second input wire and the output wire are adjacent to each other and withdrawn in a same direction, and a capacitance pattern for applying capacitance is connected at least either between the first IDT and the third IDT or between the second IDT and the third IDT,
wherein the surface acoustic wave element is connected to at least one resonator, and
wherein the capacitance pattern is determined by a resonance point which generates a resonance in an attenuation band or a resonance point which generates a resonance in an attenuation band of a high band side of a pass band.

9. The SAW device according to claim 8, wherein the capacitance pattern is any one of an electrode arranged to be opposed to two metal conductors, a first vertical IDT forming an electrode in a direction vertical to a propagation direction of a surface acoustic wave, and a second vertical IDT forming an electrode in a direction parallel to the propagation direction of the surface acoustic wave.

10. The SAW device according to claim 8, wherein the pass band is a reception band of a reception side.

11. A surface acoustic wave device comprising surface acoustic wave element including:
a first input wire;
a first IDT connected to the first input wire;
a second input wire;
a second IDT connected to the second input wire;
an output wire;
a third IDT connected to the output wire and installed between the first IDT and the second IDT; and
a first reflector and a second reflector installed on both sides of the first to third IDTs,
wherein the first input wire, the second input wire and the output wire are adjacent to each other and withdrawn in a same direction, and the first reflector is connected to the first input wire, and the second reflector is connected to the second input wire,
wherein the surface acoustic wave element is connected to at least one, resonator,
wherein a capacitance pattern for applying capacitance is connected at least either between the first IDT and the third IDT or between the second IDT and the third IDT, and
wherein the capacitance pattern is determined by a resonance point which generates a resonance in an attenuation band or a resonance point which generates a resonance in an attenuation band of a high band side of a pass band.

12. The SAW device according to claim 11, wherein the first reflector is connected to the first input wire and the second reflector is connected to the second input wire to generate capacitance.

13. The SAW device according to claim 11, wherein the capacitance pattern is any one of an electrode arranged to be opposed to two metal conductors, a first vertical IDT forming an electrode in a direction vertical to a propagation direction of a surface acoustic wave, and a second vertical IDT forming an electrode in a direction parallel to the propagation direction of the surface acoustic wave.

14. The SAW device according to claim 11, wherein the pass band is a reception band.

* * * * *